(12) United States Patent
Shinaberger et al.

(10) Patent No.: US 7,599,191 B2
(45) Date of Patent: Oct. 6, 2009

(54) ELECTROCHEMICAL LOW ESR CAPACITOR WITH CONNECTOR

(75) Inventors: Lee Shinaberger, Myrtle Beach, SC (US); Dean Smith, Middletown, PA (US); Tom Anderson, Murrells Inlet, SC (US); Bharat Rawal, Surfside Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 359 days.

(21) Appl. No.: 11/582,148

(22) Filed: Oct. 17, 2006

(65) Prior Publication Data

US 2007/0117422 A1    May 24, 2007

Related U.S. Application Data

(60) Provisional application No. 60/732,393, filed on Nov. 1, 2005.

(51) Int. Cl.
H05K 7/00    (2006.01)
(52) U.S. Cl. .................... 361/760; 439/79; 439/108
(58) Field of Classification Search ............... 361/760, 361/306.2; 439/108, 79
See application file for complete search history.

(56) References Cited

U.S. PATENT DOCUMENTS

| 4,428,633 | A | * | 1/1984 | Lundergan et al. ............ 439/70 |
| 5,295,843 | A | * | 3/1994 | Davis et al. ................. 439/108 |
| 5,666,721 | A | * | 9/1997 | Sakemi ........................ 29/843 |
| 6,572,412 | B2 | * | 6/2003 | Beuther et al. .......... 439/620.21 |
| 6,830,484 | B1 | * | 12/2004 | Lee ............................. 439/640 |
| 2003/0179550 | A1 | | 9/2003 | Nebrigic et al. |

FOREIGN PATENT DOCUMENTS

| DE | 10234395 A1 | 2/2004 |
| JP | 2165614 | 6/1990 |
| JP | 5114392 | 5/1993 |
| JP | 2001-102116 | 4/2001 |

* cited by examiner

*Primary Examiner*—Jeremy C Norris
*Assistant Examiner*—Andargie M Aychillhum
(74) *Attorney, Agent, or Firm*—Dority & Manning, P.A.

(57) ABSTRACT

An electrochemical double layer capacitor (DLC) is configured for mounting on a PCB. A first connector component is configured at each individual terminal lead of the DLC capacitor. A second connector component is mounted on the PCB and includes a number of parallel connector elements at a footprint location for electrical mating contact with the DLC leads. The connector configuration produces a minimal increase in the ESR of the capacitor when mounted on the PCB.

14 Claims, 3 Drawing Sheets

ELECTROCHEMICAL LOW ESR CAPACITOR WITH CONNECTOR

PRIORITY CLAIM

The present application claims priority to Provisional Application Ser. No. 60/732,393, filed Nov. 1, 2005.

BACKGROUND OF THE INVENTION

Electrochemical or Double Layer Capacitors (DLC), also referred to as "Supercapacitors", have gained wide acceptance in the art for providing a unique combination of characteristics, particularly high voltage, power, and capacitance densities. DLCs are an excellent compromise between dielectric capacitors, such as ceramic, tantalum, film, and batteries. DLCs are widely used in high power, pulse applications, such as in GSM, GPRS Edge, and PCS based systems, generally requiring several amps of current for a few milliseconds. DLCs are commonly used in combination with a battery to provide high momentary current requirements, with the battery providing the bulk total energy to the system and a trickle charge to the DLC when high current pulses are not required.

DLCs are generally subject to two limitations: high ESR (equivalent series resistance) and high capacitance loss when use to supply very short duration current pulses. The instant voltage drop experienced when a capacitor delivers a short current pulse is caused by and is directly proportional to the device's ESR. The continuing voltage drop over the duration of the pulse is a function of the available charge, i.e., capacitance. This combination produces a total voltage drop that may make the device unacceptable for certain applications. The voltage drop in a circuit is critical because the circuit will not operate below a certain cut-off voltage. A device's ESR cannot be reduced below a certain inherent value and, thus, high capacitance is needed to minimize total voltage drop. Such higher value capacitance, even with a higher corresponding ESR, results in a lower total voltage drop. A low voltage drop also minimizes conductive and emitted electromagnetic interference.

Conventional dielectric capacitors are typically mounted on a PCB using relatively high speed "pick and place" processes well known to those skilled in the art. The devices are then subjected to IR reflow, vapor phase or wave soldering techniques to complete the mounting process. DLCs, on the other hand, are mounted to a PCB by a hand soldering method using either a soldering iron gun, resistance, or pulse soldering equipment. This hand soldering step is an obvious detriment to efficient production of electronic components requiring a DLC. Conventional wisdom in the art holds that the hand soldering step is necessary to prevent high thermal stresses from being induced in the leads from conventional reflow and automatic soldering processes, and to maintain the device's mounted ESR at an acceptable level. Conventional connector arrangements that might be used to mount a DLC add an unacceptable contribution to ESR because of the lines and traces used for the socket/connector.

Thus, a need exists in the art for a high power electrochemical DLC that may be mounted onto a PCB without hand soldering and without a prohibitive increase in ESR. The present invention provides a solution to this need.

SUMMARY OR THE INVENTION

Objects and advantages of the invention will be set forth in part in the following description, or may be obvious from the description, or may be learned through practice of the invention.

In accordance with aspects of the invention, a DLC capacitor is configured with a first connector component at its respective terminal leads. The first connector component mates with a corresponding second connector component mounted on a PCB using conventional techniques. This connector configuration allows the DLC to be easily pressed onto the PCB such that the first and second connector components mate. Hand or other soldering techniques are not needed to electrically mount the DLC onto the PCB, and the connector configuration does not add an appreciable increase in ESR.

In a particular embodiment, the first connector component configured at each of the DLC terminals comprises a single relatively wide flange-like lead. In an alternate embodiment, a plurality of individual connector elements may be configured in parallel at each DLC terminal from a common electrode lead of the capacitor. The DLC leads (single lead or multiple parallel leads) may be configured as male connector elements having a pin or blade shape. The DLC leads mate with complementarily shaped parallel connector elements of a second connector component mounted on the PCB at a common lead For each of the capacitor leads. For example, the second connector component may include a housing mounted onto the PCB using conventional pick and place soldering techniques, the housing defining a number of connector element slots therein into which the DLC leads are received. With this arrangement, the total overall resistance $R_t$ at the individual DLC leads (when mated to the PCB) is a function of the parallel resistance of the individual connector elements ($R_1, R_2, R_3, \ldots$):

$$R_t = (1/R_1 + 1/R_2 + 1/R_3 + \ldots)^{-1}$$

By varying the size of the DLC leads and the number and type of individual connector elements in parallel on the second connector component, the total resistance at each lead can be precisely controlled. Preferably, the number, size, and shape of the DLC leads and individual connector elements is selected such that the average ESR increase at the DLC terminal leads is less than 5 milli-Ohms, and more preferably less than 3 milli-Ohms.

The second connector component may be specifically designed for use in the present invention For example, the second connector component may include a specifically designed housing mounted on the PCB at a footprint location corresponding to the terminal leads of the DLC. However, in a desirable embodiment, the second connector component configured on the PCB may be a conventional card-edge connector having a series of connector element slots disposed across a face thereof. For example, a 24, 27, or other multiple position card-edge connector may be used depending on the size of the DLC casing and spacing of the DLC leads. In this embodiment, connector elements need not be inserted into all of the card-edge connector slots, but only in those slots that will be engaged by the DLC leads. For example, it may be that only the outboard 5 or 3 positions on the card-edge connector will be used, with the intermediate positions being unused. These intermediate positions do not require connector elements.

The DLC leads have a width and thickness so as to connect with the desired number of parallel connector elements at the second connector component. In a particular embodiment, the DLC leads are configured to mate with 5 parallel connector elements mounted in a housing of the second connector component. As mentioned, this housing may be a conventional multiple position card-edge connector.

The second connector component may be mounted onto the PCB using conventional pick-and-place techniques. The connector elements may have solder tails or wire wrap tails.

Various mounting configurations and profiles are possible. For example, for a low profile configuration, it may be desired to mount the second connector component so that its connector elements allow for parallel orientation of the DLC with respect to the PCB. With card-edge connectors, this configuration is often referred to as "parallel board-to-board mounting." However, such a parallel orientation may also be achieved by the configuration of the DLC leads. For example, the DLC leads may include a right angle offset so as to connect with a card-edge connector mounted in a perpendicular "daughter card to motherboard configuration."

The DLC is placed on the PCB (e.g, by hand or automated techniques) such that the DLC leads are pressed into electrical contact with the connector elements of the second connector component. Desirably, the DLC leads extend from the casing at the insertion centerline of the second connector component. The DLC leads may require an offset for this purpose, particularly if the DLC casing is mounted flush against the PCB surface. To further secure the DLC on the PCB, adhesives or mechanical devices, such as a retaining clip or other mechanical device, may be used. For example, in one embodiment, an adhesive layer is disposed between the DLC housing and the PCB.

It should be appreciated that any number of connector configurations are within the scope and spirit of the invention for mounting DLC capacitors to a PCB while satisfying the desired design criteria of minimizing ESR contribution at each DLC terminal.

Other features and aspects of the present invention are described in more detail below by reference to one or more embodiments illustrated in the drawings.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
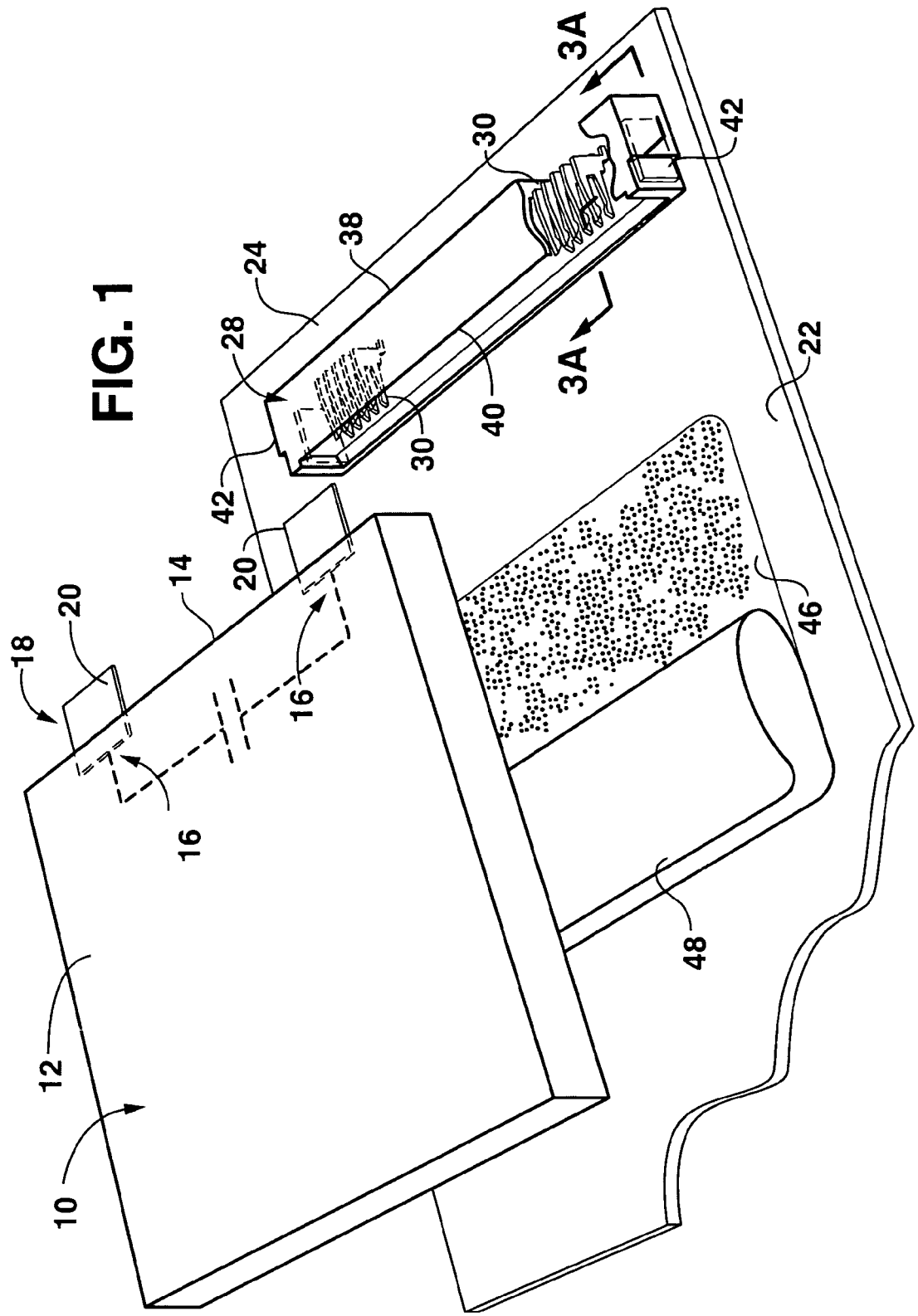
FIG. 1 is a perspective view of a suitable connector configuration from mounting a DLC capacitor to a PCB in accordance with aspects of the invention.

Repeat use of reference characters in the present specification and drawings is intended to represent same or analogous features or elements of the invention.

DETAILED DESCRIPTION

Reference now will be made in detail to various embodiments of the invention, one or more examples of which are set forth below. Each example is provided by way of explanation, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention cover such modifications and variations.

In accordance with aspects of the invention, a unique connector configuration is provided to mount a double layer electrochemical (DLC) capacitor to a printed circuit board (PCB). DLCs are known to those skilled in the art and a detailed explanation of these capacitors is not necessary for an understanding of the present invention. As mentioned above, DLC capacitors (also referred to as "electrochemical" or "super capacitors") have gained acceptance in the electronic arts for providing a unique combination of high voltage, power, and capacitance densities. DLCs are typically used in high power, high pulse applications, such as GSM, GPRS, and PCS based systems. AVX Corporation of Myrtle Beach, S.C., USA, offers a commercial line of DLC capacitors referred to as BESTCAP Ultra-low ESR supercapacitors. The BESTCAP capacitors are provided with capacitance ranges from 15 mF to 560 mF, and including six voltage ratings from 3.6 V to 12 V. Any one or combination of the BESTCAP capacitors from AVX Corporation may be utilized to practice the present invention. DLC capacitors may also be obtained from various other companies, including NEC, CAP-XX, Cooper, and Ness.

As used herein, the term "DLC capacitor" is meant to encompass any manner of electrochemical capacitor wherein charge transfer is carried out by electrons and ions and the anions and cations are contained in an electrolyte, which may be a liquid (normally an aqueous or organic solution) or a solid. The solid electrolyte is typically a conductive polymer. DLCs utilize the charge separation that is formed across the electrode-electrolyte interface. A DLC includes two types of charge carriers: ionic species on the electrolyte side, and electronic species on the electrode side. In essence, an electrochemical DLC consists of two electrodes immersed in an electrolyte. When the electrodes are being electrically charged, the ions of the electrolyte move under the influence of the electric field towards the electrodes of opposite charge. The electrodes are typically activated carbon. In the charged state, the anions and cations are located adjacent to the electrodes such that they balance the excess charge in the activated carbon electrodes. Thus, across the phase boundary between the carbon and electrolyte, there are two layers of excess charge of opposite polarity. This is referred to as an "electrochemical double layer."

As discussed above, a limitation of conventional DLCs is the equivalent series resistance (ESR) that produces an instant voltage drop when the capacitor delivers a short current pulse. The connector configuration according to the present invention provides a unique means to quickly and efficiently mount DLCs onto a PCB without adversely increasing the device's ESR rating.

Referring to FIGS. 1 through 3B in general, a DLC capacitor 10 is illustrated. The capacitor 10 includes a cell case 12 defining an anode. The DLC includes two terminal leads 16 along an edge 14 of the cell case 12.

The DLC 10 includes a first connector component, generally 18, disposed at the terminal leads 16. This first connector component 18 may comprise any manner of male or female connector element. In the illustrated embodiment, the connector component 18 is defined by a single blade or flange-like lead 20 extending from the edge 14 of the case 12. It should be appreciated that lead 20 may have various shapes and dimensions, such as pins, bayonet, or any other conventional connector configuration. In an alternate embodiment, the leads 20 may be defined by a plurality of individual parallel connector elements arranged at each of the terminal leads 16.

In a particular embodiment wherein the DLC leads 20 are single blades or flanges, as illustrated in FIG. 1, the leads may have a thickness and width so as to mate with a desired number of parallel connector elements of a second connector component 28 mounted on the PCB 22. As discussed in greater detail below, the second connector component 28 may be a card edge connector designed for receipt of connectors having an industry standard thickness, for example a thickness of 0.2 mm or other industry standard thicknesses. In this embodiment, the DLC leads would have a thickness of 0.2 mm and a width selected so as to engage with a desired number of connector elements in the card edge connector. For example, the leads may have a width of about 2.5 mm if intended to mate with 5 connector elements in a card edge connector, or a width of about 1.4 mm if intended to mate with 2 or 3 connector elements. It should be appreciated, however, that other arrangements of parallel connectors are within the scope and spirit of the invention so long as the desired minimal increase in ESR at each of the DLC terminals is achieved.

Figure 2:
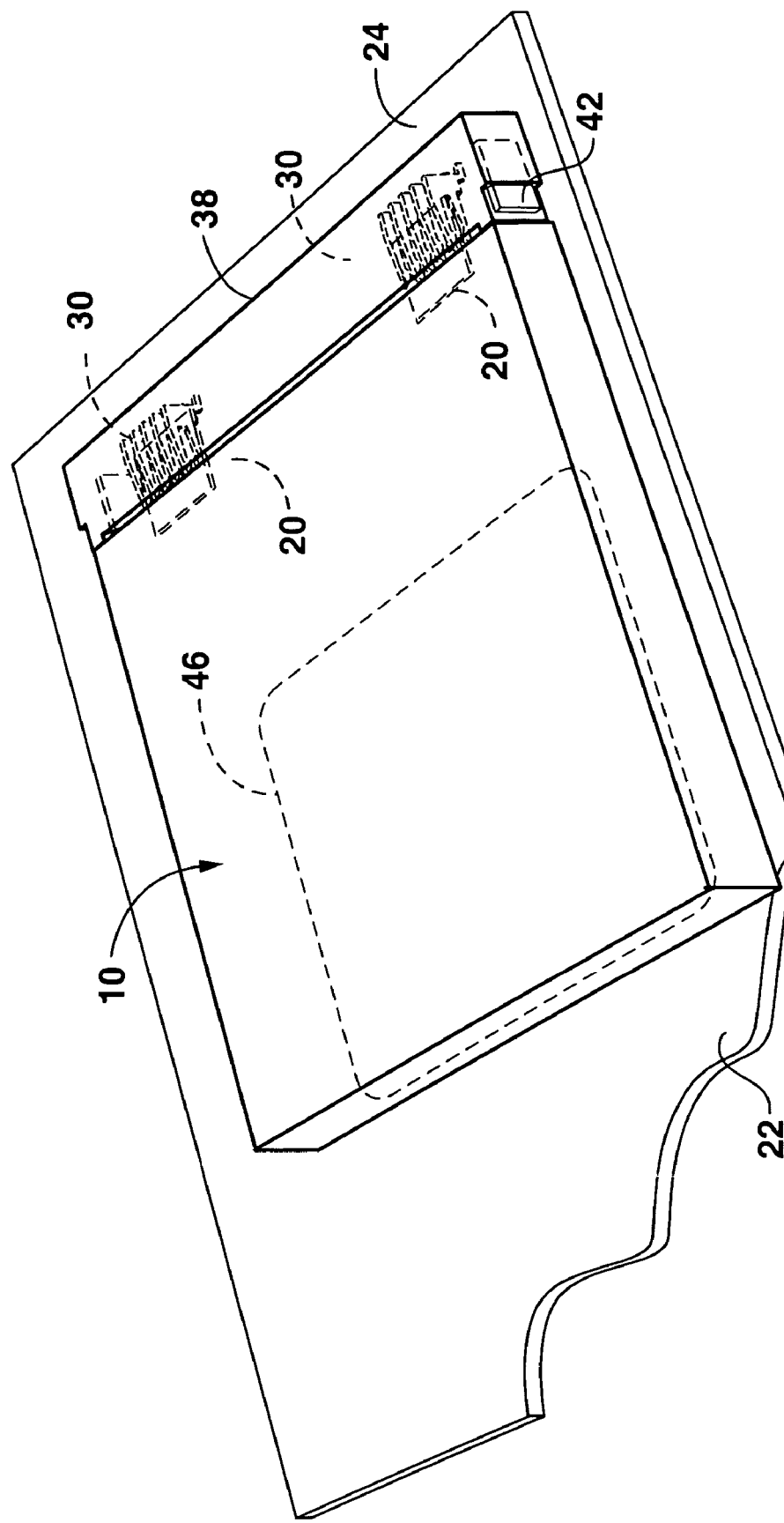
FIG. 2 is a perspective view of illustrating the DLC of FIG. 1 in a mounted configuration on the PCB.

Referring particularly to FIGS. 1 and 2, the second connector component 28 is mounted onto the upper surface 24 of the PCB 22 using conventional pick and place techniques. The component 28 is secured to the PCB 22 using any suitable conventional method. In the illustrated embodiment, the second connector component 28 includes an insulator housing 38 directly mounted onto the PCB 22 at a desired footprint containing terminal pads 26 corresponding in location and size to the terminal leads 16 of the DLC 10. The housing 38 may include anchor plates 42 at the longitudinal ends thereof for mounting the second connector component 28 onto the PCB 22 using conventional pick and place and solder techniques. The component 28 may include solder tails for the respective connector elements, or a wire wrap configuration. As discussed above, the second connector component 28 may be a card edge connector having parallel connector elements 30 that mate with the leads 20 at the DLC terminals. It should be appreciated that any number of connector devices or components may be utilized for this purpose.

Figure 3A:
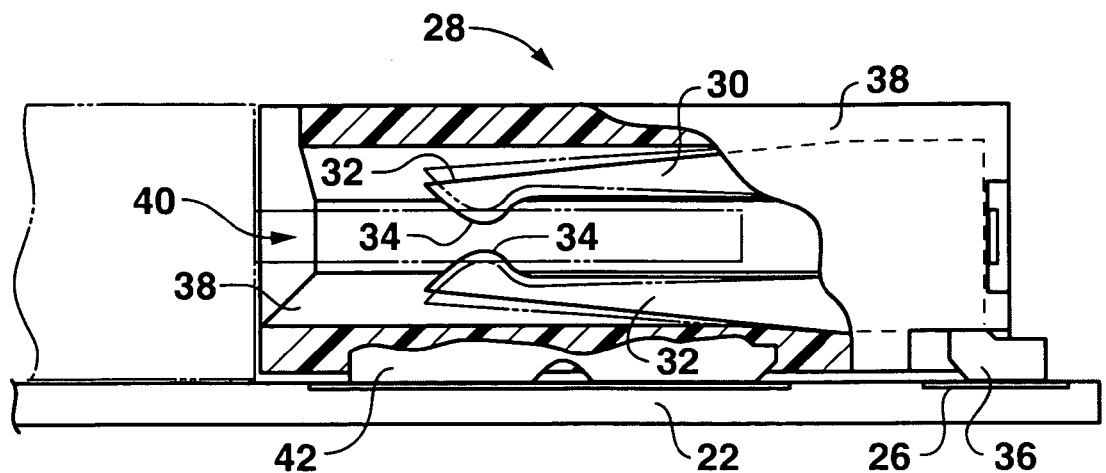
FIG. 3A is a cut-away view of the PCB connector component of FIG. 1 mounted on the PCB.
Figure 3B:
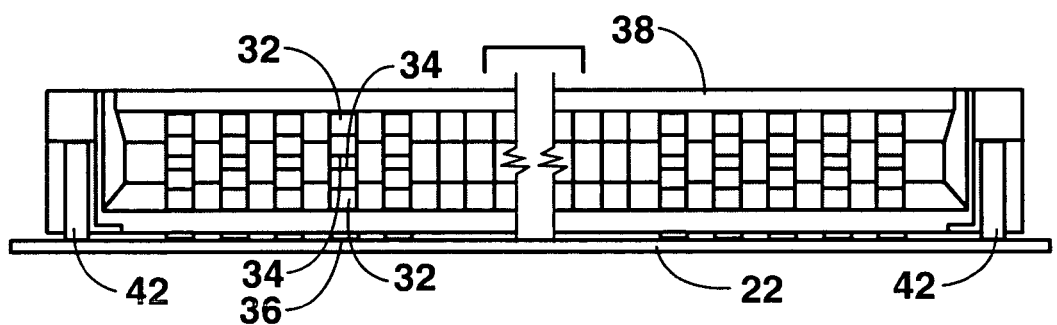
FIG. 3B is a front view of the PCB connector component of FIG. 3A

As in the case of a card edge connector, the housing 38 may define a plurality of individual slots 40 defined at locations across a face of the housing, with the face oriented for receipt of the DLC leads 20. The sockets include individual connector elements 30 having a shape and size so that a plurality of the elements electrically mate with the DLC leads 20 at each of the terminal leads 16. For example, in the embodiment illustrated in the figures, the connector elements 30 are defined by biased arms 32 with barbs 34 at the ends thereof. The arms 32 define a V-shaped or U-shaped slot into which the DLC leads 20 extend. Each lead 20 spans across a plurality of the elements 30. In the illustrated embodiment, each lead 20 spans 5 connector elements 30. Each connector element 30 may include a tail 36 soldered to a terminal pad 26 on the board 22, as illustrated in FIG. 3.

The housing 38 may include slots 40 across the entire face thereof, particularly if the second connector component 28 is a card edge connector. In this case, connector elements 30 need only be disposed in those sockets needed for mating contact with the DLC leads 20. For example, the housing 38 may contain twenty-seven or twenty-four slot locations, wherein only the 5 outboard slots 40 at each end are used to mate with the DLC leads 20.

Preferably, the DLC leads are oriented so as to extend at the insertion centerline of the slots 40 in the second connector component 28. Depending on the thickness of the DLC case 12 and other variables, it may be necessary to form the leads 20 with an offset for this purpose, particularly if it is desired to mount the DLC flush against the PCB 22.

It should be appreciated by those skilled in the art that any manner of suitable connector configurations may be utilized within the scope of the spirit of the invention, and that the configuration illustrated in the figures is an example of one suitable configuration.

The present inventors have found that providing individual parallel connector elements at each of the DLC terminals provides for sufficient contact strength and surface area, while minimizing the overall ESR increase of the device. The mating connector components allow for secure electrical mounting of the DLC 10 onto the PCB 22 without any sort of soldering. The DLC terminals 16 and associated leads 20 are not subjected to the high thermal stresses of an automated reflow soldering process. The number, size, and configuration of the DLC leads and individual connector elements may be varied depending upon the power and capacitance rating of the DLC 10 to achieve a minimum acceptable ESR increase at the terminal leads. In particularly desirable embodiments, the overall ESR increase from the lead/connector configuration is less than 5 milli-ohms, and preferably less than 3 milli-ohms.

In order to ensure that the DLC 10 remains attached to the PCB 22 in all operating environments of the electronic components, additional means may be utilized to secure the DLC casing 12 to the PCB 22. For example, referring to FIG. 1, an adhesive 46 may be placed between the bottom of the casing 12 and the PCB 22. This casing may be protected by a release liner 48 that is peeled away prior to mounting of the DLC 10. The adhesive may be provided on the PCB 22 at the desired footprint location, as illustrated in FIG. 1, or may be provided on the underside of the DLC casing 12. In other embodiments, conventional mechanical attaching devices may be utilized to further secure the DLC 10 relative to the PCB 22, such devices may include clips, screws, male/female engagement devices, and so forth.

FIG. 2 illustrates the DLC casing 12 generally flush against the second connector component housing 38. In an alternate embodiment, the casing 12 may be spaced from the housing 38 with the connector elements 20 bridging the gap between the components. This embodiment allows for insertion of the DLC connector elements at an angle relative to the component housing 38, which may be needed for lower profile connector configurations.

Test Data

Tests were conducted utilizing BESTCAP DLC capacitors from AVX Corporation to determine the increase in ESR with a five parallel connector configuration at each of the two terminal leads of the capacitor. The capacitors tested were part number BZ05 rated at 5.5 volts. The capacitors were configured with blade-type leads at each terminal having a thickness of 0.2 mm and a width of 2.5 mm. A card edge connector was configured on a PCB for engagement of 5 connector elements at each longitudinal end of the connector by the DLC leads. In a first test, the card edge connector was a 24 position connector (the middle 14 positions of the housing did not contain connector elements and were not used). In a second test, the card edge connector was a 27 position connector, wherein the middle 17 positions of the housing were not used.

Five different capacitors were tested with each of the connector configurations. Each capacitor was tested ten times. Each test consisted of measuring the capacitor ESR in an unconnected state (not electrically mated to the PCB). The capacitor was then mated with the connector housing on the PCB and ESR of the mated configuration was determined. The difference in ESR values between the two readings is attributed to the connector configuration. This procedure was conducted on each capacitor a total of ten times.

For the capacitors tested with the 24 position connector, the average increase in ESR was 1.9 milli-ohms (with a standard deviation of 1.7). For the capacitors tested with the 27 position connector, the average increase in ESR was 2.1 milli-ohms (with a standard deviation of 1.8).

While the invention has been described in detail with respect to the specific embodiments thereof, it will be appreciated that those skilled in the art, upon attaining an understanding of the foregoing, may readily conceive of alterations to, variations of, and equivalents to these embodiments. Accordingly, the scope of the present invention should be assessed as that of the appended claims and any equivalents thereto.

What is claimed is:

1. A Double Layer Capacitor capacitor configured for mounting on a PCB, comprising a first connector component configured at each individual terminal lead of said Double Layer Capacitor capacitor having a shape and configuration for electrical mating without soldering to a second connector component on a PCB, and wherein said shape and configuration of said first connector components with respect to the second connector components on the PCB minimizes an ESR increase of said capacitor from connection between said first connector components and the second connector components of the PCB is less than about 5 milli-ohms.

2. The Double Layer Capacitor capacitor as in claim 1, wherein said ESR increase of said capacitor from connection between said first connector components and the second connector components of the PCB is less than about 3 milli-ohms.

3. A Double Layer Capacitor capacitor configured for mounting on a PCB, comprising a first connector component configured at each individual terminal lead of said Double Layer Capacitor capacitor having a shape and configuration for electrical mating without soldering to a second connector component on a PCB, and wherein the second connector component of the PCB has a plurality of individual parallel connector elements, said respective terminal leads of the Double Layer Capacitor having a width so as to engage with a plurality of said parallel connector elements.

4. The Double Layer Capacitor capacitor as in claim 3, wherein said Double Layer Capacitor capacitor includes a casing, said casing and first connector components configured so that said casing lies flat against the PCB upon mating said first connector components with the second connector components of the PCB.

5. The Double Layer Capacitor capacitor as in claim 4, further comprising an additional attachment device between said casing and the PCB.

6. The Double Layer Capacitor capacitor as in claim 5, wherein said additional attachment device comprises an adhesive.

7. A combination of a Double Layer Capacitor capacitor configured on a PCB, comprising a DLC capacitor with a first connector component configured at each individual terminal lead of said Double Layer Capacitor capacitor, and a second connector component configured on the PCB including at least one connector element assigned to a respective said terminal lead of the Double Layer Capacitor, the Double Layer Capacitor leads electrically engaged with said second connector component without soldering, and wherein an ESR increase of said capacitor from connection between said first connector components and said second connector components of said PCB is less than about 5 milli-ohms.

8. The combination as in claim 7, wherein said ESR increase of said capacitor from connection between said first connector components and said second connector components of said PCB is less than about 3 milli-ohms.

9. A combination of a Double Layer Capacitor capacitor configured on a PCB, comprising a Double Layer Capacitor capacitor with a first connector component configured at each individual terminal lead of said Double Layer Capacitor capacitor, and a second connector component configured on the PCB including at least one connector element assigned to a respective said terminal lead of the Double Layer Capacitor, the Double Layer Capacitor leads electrically engaged with said second connector component without soldering, and wherein said second connector component of the PCB has a plurality of individual parallel connector elements, said respective terminal leads of the Double Layer Capacitor having a width so as to engage with a plurality of said parallel connector elements.

10. The combination as in claim 9, wherein said second connector component comprises a card edge connector mounted on said PCB.

11. A combination of a Double Layer Capacitor capacitor configured on a PCB, comprising a Double Layer Capacitor capacitor with a first connector component configured at each individual terminal lead of said Double Layer Capacitor capacitor, and a second connector component configured on the PCB including at least one connector element assigned to a respective said terminal lead of the Double Layer Capacitor, the Double Layer Capacitor leads electrically engaged with said second connector component without soldering, and wherein said Double Layer Capacitor capacitor includes a casing, said casing and first connector components configured so that said casing lies flat against said PCB upon mating said first connector components with said second connector components of the PCB.

12. The combination as in claim 11, wherein said second connector component comprises a card edge connector mounted on said PCB, said casing having a thickness generally matching a thickness of said card edge connector so that said Double Layer Capacitor mounts flush with said card edge connector on said PCB.

13. The combination as in claim 12, further comprising an additional attachment device between said casing and said PCB.

14. The combination as in claim 13, wherein said additional attachment device comprises an adhesive.

* * * * *